United States Patent [19]

Umeda

[11] 4,041,334
[45] Aug. 9, 1977

[54] CONTROL CIRCUIT FOR ACTUATING A DEVICE AT A DELAYED TIME WITH RESPECT TO THE TURNING ON OF A POWER SUPPLY AND FOR DEACTUATING THE DEVICE SUBSTANTIALLY SIMULTANEOUSLY WITH THE TURNING OFF OF THE POWER SUPPLY

[75] Inventor: Kaoru Umeda, Kawasaki, Japan

[73] Assignee: Sony Corporation, Tokyo, Japan

[21] Appl. No.: 659,689

[22] Filed: Feb. 20, 1976

[30] Foreign Application Priority Data

Feb. 22, 1975    Japan .................................. 50-22135

[51] Int. Cl.² .......................... H03K 5/13; H01H 47/18
[52] U.S. Cl. .................................. 307/293; 307/261;
307/262; 328/26; 328/28; 328/32; 328/131; 361/196
[58] Field of Search ................... 307/261, 293, 262;
328/26, 28, 32, 156, 157, 129, 131; 317/141 S

[56] References Cited

U.S. PATENT DOCUMENTS

| | | | |
|---|---|---|---|
| 2,292,100 | 8/1942 | Bliss | 328/32 |
| 2,598,491 | 5/1952 | Bergfors | 328/32 |
| 3,054,062 | 9/1962 | Vonarburg | 307/232 |
| 3,443,126 | 5/1969 | Meyer | 307/261 |
| 3,558,925 | 1/1971 | Broverman | 328/26 |
| 3,575,639 | 4/1971 | Shaw et al. | 317/141 S |
| 3,582,715 | 6/1971 | Traina | 317/141 S |
| 3,683,301 | 8/1972 | Boley et al. | 317/141 S |
| 3,835,352 | 9/1974 | Clarke | 317/141 S |

*Primary Examiner*—Stanley D. Miller, Jr.
*Attorney, Agent, or Firm*—Lewis H. Eslinger; Alvin Sinderbrand

[57] ABSTRACT

A control circuit includes two full-wave rectifiers connected to an AC power source to produce two rectified outputs having different phases with respect to each other, a combining circuit for combining the two rectified outputs to produce a composite output, and a switching means controlled by the composite output. The switching means generates a control signal nearly at the same time that the AC power supply is switched on or off. The control signal is used to energize a device at a delayed time after the AC power supply is switched on, and to de-energize the device substantially at the same time that the AC power supply is switched off.

11 Claims, 5 Drawing Figures

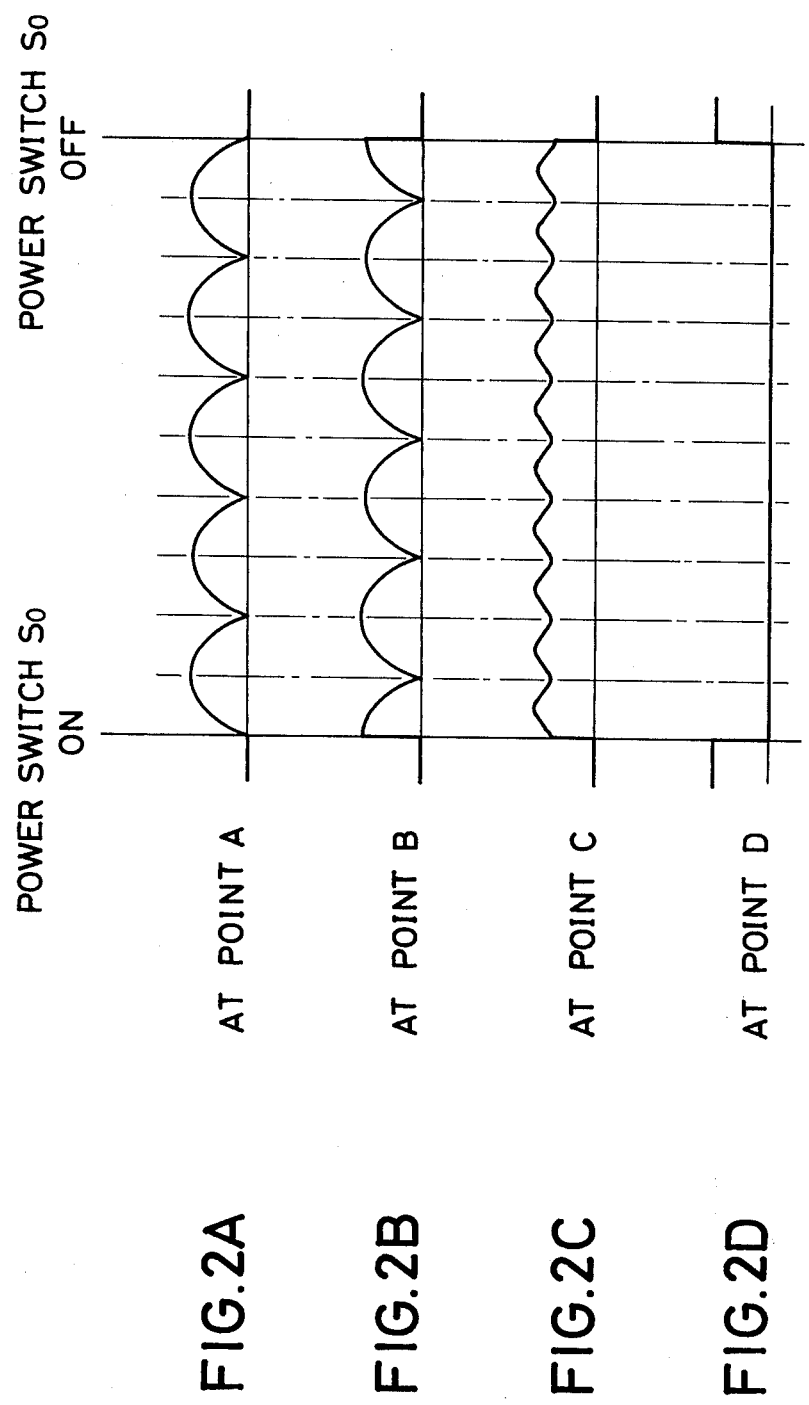

CONTROL CIRCUIT FOR ACTUATING A DEVICE AT A DELAYED TIME WITH RESPECT TO THE TURNING ON OF A POWER SUPPLY AND FOR DEACTUATING THE DEVICE SUBSTANTIALLY SIMULTANEOUSLY WITH THE TURNING OFF OF THE POWER SUPPLY

BACKGROUND OF THE INVENTION

This invention relates to a control circuit, and more particularly, to a control circuit which operates at a high speed in substantially instantaneous response to ON-OFF operations of an AC power source to produce a control signal which can be used to energize or de-energize a device in an electronic apparatus.

In some electronic apparatus there often is a problem associated with the turning on or off of input power. This problem is caused by the current peaks which accompany the initial supply of power or the abrupt termination thereof. For example, in audio apparatus having a sound transducer, such as a loudspeaker, driven by an amplifier, a so-called "popping" noise often is produced a short time after AC power initially is supplied to the apparatus, or after such AC power is cut off. This popping noise is produced in response to the discharge of capacitors included in the circuits of the audio apparatus. When the popping noise signal is supplied to the loudspeaker, a distracting and audibly uncomfortable sound is generated. Under certain circumstances, the loudspeaker can be damaged by the popping noise and its associated current peaks.

In order to avoid supplying the popping noise and current peaks to the loudspeaker, a special switch ganged with the usual power switch is connected in a circuit coupled with the loudspeaker. This current coupled to the loudspeaker is opened by the special switch, simultaneously with the turning off of the power switch. Although this circuit arrangement is, in most instances, satisfactory, its preventive function is effectively by-passed if the power supply cord for the apparatus is separated from the power source, e.g. pulled from its plug-socket. In that instance, which is not infrequent, the popping noise cannot be avoided.

In another arrangement, the ripple voltage of the DC power source of the apparatus is detected to drive a control signal. This control signal is used as a muting signal to open and close a gate circuit coupled to the loudspeaker. However, since the DC power supply circuit usually includes a capacitor of high capacitance, and thus a large time constant, the ripple voltage will be detected following a relatively long time delay after the power switch is turned on or turned off. Consequently, the gate circuit will not be closed until the ripple voltage is detected, and the opened gate circuit will allow the popping noise to be produced when the power switch is operated.

OBJECTS OF THE INVENTION

Accordingly, it is an object of this invention to provide an improved control circuit which overcomes the above described disadvantages.

Another object of this invention is to provide a control circuit which includes first and second rectifying circuits to produce first and second outputs of different phase, and in which the first and second outputs are combined to produce a composite signal for controlling a switching circuit.

A further object of this invention is to provide a control circuit which can operate at high speed in substantially instantaneous response to the ON-OFF operations of a power supply.

A still further object of this invention is to provide a switch control for operating a switching circuit including a capacitor, so as to turn on a device at a predetermined delay time after power first is switched on, and to turn off the device substantially at the same time that the power is switched off.

Another object of this invention is to provide a control circuit for controlling an output device so as to avoid the application of peak currents to that device when power is turned on and off.

Various other objects and advantages of the invention will become apparent from the ensuing description, and the novel features will be particularly pointed out in the appended claims.

SUMMARY OF THE INVENTION

In accordance with one aspect of this invention, a control circuit includes first and second rectifying circuits adapted to be connected to an AC power source to produce first and second outputs of different phases, a combining circuit for combining the first and second outputs to produce a composite signal, and a switching circuit to be controlled by the composite signal.

It is one feature of this invention for the switching circuit to energize a device at a time delayed subsequent to the connection fo an AC power source, and to de-energize the device at substantially the same time that the AC power source is disconnected.

BRIEF DESCRIPTION OF THE DRAWINGS

The following detailed description, given by way of example, will best be understood when read in conjunction with the accompanying drawings, wherein:

FIGS. 2A through 2D represent waveforms of signals produced at different points in the circuit shown in FIG. 1.

DETAILED DESCRIPTION OF A CERTAIN ONE OF THE PREFERRED EMBODIMENTS

Figure 1:
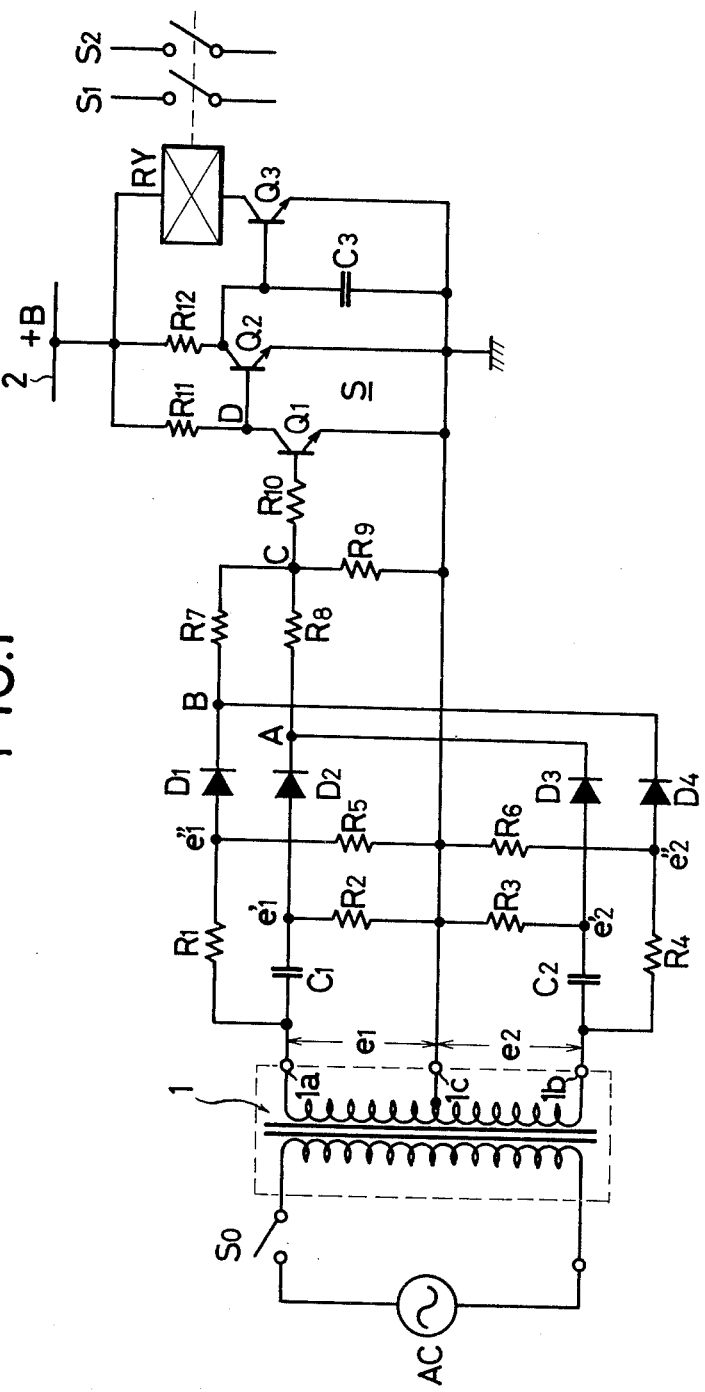
FIG. 1 is a schematic diagram of one embodiment of a control circuit according to this invention.

One embodiment of a switch control circuit in accordance with the teachings of this invention now will be described with reference to the schematic diagram shown in FIG. 1.

The primary winding of a power transformer 1 is adapted to be supplied with AC power when an input power switch So is closed. The secondary winding of the power transformer 1 is provided with output terminals 1a and 1b and with a center tap 1c connected to a reference potential, such as ground. Oppositely phased voltages $e_1$ and $e_2$ are obtained at the output terminals 1a and 1b of the transformer secondary winding. The output terminal 1a is connected through a resistor $R_1$ to the anode of a rectifier diode $D_1$, and through a phase-advancing capacitor $C_1$ to the anode of a rectifier diode $D_2$. The anodes of the rectifier diodes $D_1$ and $D_2$ are additionally connected through voltage-divider resistors $R_5$ and $R_2$, respectively, to ground.

The other output terminal 1b of the transformer secondary winding is connected through a phase-advancing capacitor $C_2$ to the anode of a rectifier diode $D_3$, and through a resistor $R_4$ to the anode of a rectifier diode $D_4$. The anodes of these rectifier diodes $D_3$ and $D_4$ are additionally connected through voltage-divider resistors $R_3$ and $R_6$, respectively, to ground.

The cathodes of the rectifier diodes $D_1$ and $D_4$ are connected in common to a point B, whereat the outputs of the rectifier diodes $D_1$ and $D_4$ are added. This common-connection point B is connected through resistors $R_7$ and $R_{10}$ to the base electrode of a transistor $Q_1$. The junction C defined by the resistors $R_7$ and $R_{10}$ is connected through a resistor $R_9$ to ground, thus forming a voltage-divider circuit of the resistors $R_7$ and $R_9$.

The cathodes of the rectifier diodes $D_1$ and $D_3$ are connected in common to a point A, whereat the outputs of the rectifier diodes $D_2$ and $D_3$ are added. This common-connection point A is connected through resistor $R_8$ to the junction C, and thence through the resistor $R_{10}$ to the base electrode of the transistor $Q_1$. The resistors $R_8$ and $R_9$ thus form another voltage divider circuit.

The transistor $Q_1$ is included in a switching circuit S. The collector electrode of the transistor $Q_1$ is seen to be connected through a load resistor $R_{11}$ to a +B DC power supply line 2, and its emitter electrode is connected to ground. A control signal, such as an output voltage, is obtained at the collector electrode (point D) of the transistor $Q_1$ and is applied directly to the base electrode of a transistor $Q_2$. The emitter electrode of the transistor $Q_2$ is connected to ground, and its collector electrode is connected through a load resistor $R_{12}$ to the +B DC power supply line 2. The collector electrode of the transistor $Q_2$ is further connected directly to the base electrode of a transistor $Q_3$, and also through a capacitor $C_3$ to ground.

When the transistor $Q_2$ is non-conductive, a charging current flows through a load resistor $R_{12}$ to the capacitor $C_3$. Conversely, when the transistor $Q_2$ is conductive, a discharge current flows from the capacitor $C_3$ through the transistor $Q_2$ to ground. A relay RY is connected between the collector electrode of the transistor $Q_3$ and the +B DC power supply line 2, so that when the base voltage of the transistor $Q_3$ is sufficient to render the transistor conductive, the relay RY is energized. This, in turn, closes (or opens) relay switches $S_1$ and $S_2$, which are connected to further apparatus, such as between an amplifier and a loudspeaker (not shown).

In operation, let it be assumed that an AC voltage of approximately 100V is applied to the primary winding of the power transformer 1 when the input power switch So is closed. This, of course, produces output voltages $e_1$ and $e_2$ of predetermined values between the terminals 1a and 1c and between the terminals 1b and 1c, respectively, of the transformer secondary winding. The output voltages $e_1$ and $e_2$ are oppositely phased with respect to each other, referenced to the center tap 1c.

The output voltage $e_1$ is phase-advanced by 90° by the filter formed of the capacitor $C_1$ and resistor $R_2$, and is voltage-divided by the resistor $R_2$, so that an output voltage $e_1'$ of predetermined amplitude and phase is supplied to the anode of the diode $D_2$. This output voltage $e_1'$ is half-wave rectified by the diode $D_2$. The output voltage $e_1$ at the terminal 1a also is voltage-divided by the resistors $R_1$ and $R_5$, so that an output voltage $e_1''$ of predetermined amplitude and phase is supplied to and half-wave rectified by the diode $D_1$.

Similarly, the output voltage $e_2$ at the terminal 1b is phase-advanced by 90° by the filter formed of the capacitor $C_2$ and the resistor $R_3$, and is voltage-divided by the resistor $R_3$, so that an output voltage $e_2'$ of predetermined amplitude and phase is supplied to the anode of the diode $D_3$. This output voltage $e_2'$ is half-wave rectified by the diode $D_3$. The output voltage $e_2$ at the terminal 1b also is voltage-divided by the resistors $R_4$ and $R_6$ so that an output voltage $e_2''$ of predetermined amplitude and phase is supplied to and rectified by the diode $D_4$.

The rectified voltages produced by the diodes $D_2$ and $D_3$ and added at the point A, to obtain a full-wave rectified output voltage as shown in FIG. 2A. Similarly, the rectified voltages produced by the diodes $D_1$ and $D_4$ are added at the point B, to obtain another full-wave rectified output voltage as shown in FIG. 2B. Since the rectified voltages produced by the diodes $D_2$ and $D_3$ are shifted in phase by 90° with respect to the rectified voltages produced by the diodes $D_1$ and $D_4$, respectively, the output voltage at the point A is shifted in phase by 90° in comparison with the output voltage at the point B, as is seen.

These output voltages at points A and B, having different phases with respect to each other, are applied to the point C by the resistors $R_7$ and $R_8$, which may be considered as components of a mixing circuit. The resultant output voltage at point C is shown in FIG. 2C. Although it exhibits a ripple factor, this output voltage has a nearly constant level, which is determined by the values of the resistors $R_9$ (which also may be considered as another component of the mixing circuit), $R_7$ and $R_8$. The output voltage at point C is applied through a current limiting resistor $R_{10}$ to the base electrode of the transistor $Q_1$, to drive the transistor into its conductive state. Accordingly, the current flowing through the load resistor $R_{11}$ increases, thereby reducing the collector voltage at point D and thus the voltage applied to the base electrode of the transistor $Q_2$ to a minimum level, as shown in FIG. 2D.

When the base voltage of the transistor $Q_2$ is reduced as shown, this transistor is rendered non-conductive and its collector voltage thus increases. Accordingly, current flows to the capacitor $C_3$ through the load resistor $R_{12}$ from the +B DC power supply line 2 to charge the capacitor in accordance with the time constant determined by the value of the load resistor $R_{12}$ and the value of the capacitor $C_3$. The voltage on the capacitor $C_3$ is applied to the base electrode of the transistor $Q_3$, and when the capacitor has been charged to a predetermined level, the transistor $Q_3$ is rendered conductive. At that time, current flows through a relay RY and through the conductive transistor $Q_3$ to energize the relay which, in turn, operates (e.g. closes) the switches $S_1$ and $S_2$.

In one application of the illustrated apparatus wherein the switches $S_1$ and $S_2$ are connected between an audio amplifier and a loudspeaker, it is appreciated that audio signals are supplied to the loudspeaker at a predetermined time following the initial supply of AC power. Thus, instantaneous current peaks which are induced when power first is supplied, i.e. turned on, are not applied to the loudspeaker. Consequently, the risk of damage caused by such current peaks is substantially avoided.

Let it now be assumed that AC power is removed from the power transformer, as by opening the input power switch So. When the input AC voltage is terminated, the output voltage at point C is reduced to zero substantially instantaneously, as shown in FIG. 2C. This renders the transistor $Q_1$ non-conductive and its collector voltage increases, as shown in FIG. 2D. Accordingly, the transistor $Q_2$ now is conductive to provide a discharge current path from the capacitor $C_3$ to ground.

The capacitor $C_3$ discharges substantially instantaneously to drive the transistor $Q_3$ to its non-conductive state, thereby reducing the current flowing through the relay RY to a minimum. As a result, the relay RY is de-energized, and the switches $S_1$ and $S_2$ are opened.

The switches $S_1$ and $S_2$ are opened at substantially the same time as the termination of AC power. Accordingly, instantaneous current peaks caused by power cut-off are not supplied to the loudspeaker. Thus, the loudspeaker does not produce the aforenoted distracting popping noise, which would be heard otherwise.

If this invention is used in conjunction with audio apparatus, as above described, audio signals will be supplied to the loudspeaker at a predetermined time following the initial supply of AC power to that apparatus; and the loudspeaker will be disconnected from its driving circuit substantially at the same time that the AC power is removed from the apparatus. Thus, the loudspeaker is protected from possible damage caused by transients which may be applied thereto when power is turned on and turned off; and the objectionable popping noise which is generated at such times is avoided. In accordance with one advantageous feature, the switch control circuit of this invention can operate at high speed so as to be instantaneously responsive to the effective turning on and turning off of the AC power supply. Consequently, this circuit is useful for various and different types electronic apparatus.

In the above described embodiment, it is assumed that the +B DC power supply voltage is constant at a certain level immediately before the power switch So is turned on (i.e. closed), and immediately after the power switch is turned off (i.e. opened). However, the +B DC power supply voltage may be derived through a power supply circuit which, in turn, is supplied by the power transformer 1. Typically, such a power supply circuit includes a smoothing capacitor of very high capacitance, so that the +B DC power supply voltage rises and falls relatively slowly after the power switch So is turned on and off, respectively. Thus, when considered in comparison to the operation of the circuit shown in FIG. 1, the +B DC power supply voltage is equal to zero or nearly zero immediately before and after the power switch So is closed, and is substantially constant at a certain level immediately before and after the power switch So is opened. Hence, for the arrangement wherein the +B DC power supply voltage is derived from the input AC power, the waveform of the output voltage at point D is almost unchanged from that shown in FIG. 2D, except that it is zero before the power switch So is closed. Of course, the circuit of FIG. 1 operates in the same way as in the above-described embodiment.

While the present invention has been particularly shown and described with reference to one preferred embodiment as a switch control circuit and with reference to its use with audio apparatus, it should be readily apparent that this invention is adapted to produce a control signal in response to the supply and termination of AC energy. Also, this invention finds broad application to apply this control signal to any other electrical apparatus. It is further apparent that one of ordinary skill in the art can make various changes and modifications in the form and details of the apparatus described herein without departing from the spirit and scope of the invention. Accordingly, it is intended that the appended claims be interpreted as including all such changes and modifications.

What is claimed is:
1. A control circuit comprising:
 means for receiving an AC voltage;
 first rectifying means coupled to said receiving means for producing a first output;
 second rectifying means coupled to said receiving means for producing a second output, said first and second outputs having a predetermined phase difference therebetween;
 means for combining said first and second outputs to produce a third output, said third output commencing when said AC voltage first is received and terminating when said AC voltage no longer is received;
 energizing means coupled to said combining means and responsive to the commencement of said third output for producing an energizing signal at a predetermined delayed time subsequent thereto and responsive to the termination of said third output for substantially simultaneously terminating said energizing signal; and
 switching means coupled to said energizing means and controlled by said energizing signal.

2. A control circuit according to claim 1, wherein one of said rectifying means includes phase shifting means for providing a phase shift of one of said first and second outputs relative to the other by a predetermined amount.

3. A control circuit according to claim 2, wherein said phase shifting means consists of a capacitor and a resistor for providing a phase shift of 90°.

4. A control circuit according to claim 1, wherein said combining means comprises a first resistor coupled to said first rectifying means for receiving said first output; a second resistor coupled to said second rectifying means for receiving said second output; and a third resistor coupled to said first and second resistors in common to derive said third output and to supply said third output to said energizing means.

5. A control circuit comprising:
 means for receiving an AC voltage;
 first rectifying means coupled to said receiving means for producing a first output;
 second rectifying means coupled to said receiving means for producing a second output, said first and second outputs having a predetermined phase difference therebetween;
 means for combining said first and second outputs to produce a third output;
 a first switching element having a control electrode coupled to said combining means, one output electrode coupled to a reference point, and a second output electrode coupled to a source of DC voltage through a first load resistor;
 a second switching element having a control electrode connected to said second output electrode of said first switching element, one output electrode coupled to said reference point, and a second output electrode coupled to said source of DC voltage through a second load resistor, said second output electrode of said second switching element being further coupled to said reference point through a capacitor; and
 a third switching element having a control electrode connected to said second output electrode of said second switching element, one output electrode coupled to said reference point, and a second output electrode coupled to said source of DC voltage through controllable means.

6. A control circuit for energizing a device at a time subsequent to the application of AC power and for de-energizing said device at substantially the same time as the termination of said AC power, comprising:
a power transformer for receiving said AC power;
first rectifying means coupled to said power transformer for producing a first rectified output signal in response to said received AC power;
second rectifying means coupled to said power transformer for producing a second rectified output signal phase shifted from said first rectified output signal;
combining means coupled to said first and second rectifying means for combining said first and second rectified output signals to produce a DC level having a ripple factor;
energizing means coupled to said combining means for producing an energizing signal at a time delayed from the time said DC level is produced and for terminating said energizing signal substantially at the same time said DC level is terminated; and
means for energizing said device in response to said energizing signal.

7. A control circuit according to claim 6 wherein said first rectifying means is a full-wave rectifier; and said second rectifying means comprises phase-shifting means coupled to said power transformer and a second full-wave rectifier coupled to said phase-shifting means.

8. A control circuit according to claim 7 wherein said energizing means includes capacitance means; a charging path operatively coupled to said capacitance means when said DC level is produced for charging said capacitance means to produce said energizing signal; and a discharge path operatively coupled to said capacitance means when said DC level is terminated; said charging path having a greater time constant than said discharge path.

9. A control circuit for energizing a device at a time subsequent to the application of AC power and for de-energizing said device at substantially the same time as the termination of said AC power, comprising a power transformer for receiving said AC power; a first full wave rectifier coupled to said power transformer for producing a first rectified output signal in response to said received AC power; phase-shifting means coupled to said power transformer and a second full wave rectifier coupled to said phase-shifting means for producing a second rectified output signal phase shifted from said first rectified output signal; combining means coupled to said first and second rectifying means for combining said first and second rectified output signals; energizing means coupled to said combining means for producing an energizing signal at a time delayed from the time said first and second rectified output signals are produced and for terminating said energizing signal substantially at the same time said first and second rectified output signals are terminated, said energizing means including capacitance means, a charging path comprising a resistor for coupling a DC voltage to said capacitance means when said first and second rectified output signals are produced for charging said capacitance means to produce said energizing signal, a discharge path comprising a transistor connected in shunt relation with said capacitance means and rendered non-conductive when said first and second rectified output signals are produced and conductive when said first and second rectified output signls are terminated, and a further transistor responsive to said energizing signal for establishing a current conducting path; and means for energizing said device in response to said current conducting path.

10. A control circuit according to claim 1 wherein said energizing means comprises a capacitor for storing a voltage and for applying said stored voltage to said switching means; a charging circuit coupled to said capacitor and made operable when said third output commences so as to charge said capacitor; and a discharging circuit to said capacitor and made operable when said third output terminates, said charging circuit having a higher impedance than said discharging circuit.

11. A control circuit for operating a switching device in response to the turning on and turning off of an AC power supply, comprising converting means coupled to said AC power supply for receiving the voltage supplied by said AC power supply and for converting same to a substantially constant DC level when said AC power supply is turned on and for terminating said DC level when said AC power supply is turned off, a capacitor; a DC power supply for producing a DC voltage; impedance means coupled between said DC power supply and said capacitor for supplying said DC voltage to said capacitor; a first transistor coupled to said converting means, said first transistor being conductive in response to the production of said DC level; and a second transistor coupled to said first transistor and connected to said capacitor in a discharge path therefor, said second transistor being non-conductive when said first transistor is conductive and being conductive when said first transistor is non-conductive, whereby said capacitor is charged through said impedance means when said first transistor is conductive in response to said production of said DC level so as to produce a turn-on signal at a predetermined time following the production of said DC level, and whereby said first transistor is non-conductive and said second transistor is conductive substantially simultaneously with the termination of said DC level for discharging said capacitor through said second transistor so as to substantially simultaneously terminate said turn-on signal; and a switching device supplied with and actuated by said turn-on signal.

* * * * *